US011337311B2

(12) United States Patent
Brandt et al.

(10) Patent No.: US 11,337,311 B2
(45) Date of Patent: May 17, 2022

(54) AIRCRAFT WINDOW WITH VARIABLE POWER DENSITY HEATER FILM

(71) Applicant: PPG Industries Ohio, Inc., Cleveland, OH (US)

(72) Inventors: Micheal Joseph Brandt, Simi Valley, CA (US); Eric Christopher Sasse, Los Angeles, CA (US); Krishna K. Uprety, Valencia, CA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

(21) Appl. No.: 16/502,425

(22) Filed: Jul. 3, 2019

(65) Prior Publication Data

US 2020/0015358 A1   Jan. 9, 2020

Related U.S. Application Data

(60) Provisional application No. 62/694,703, filed on Jul. 6, 2018.

(51) Int. Cl.
*H05K 3/12* (2006.01)
*B60S 1/02* (2006.01)
*B64C 1/14* (2006.01)

(52) U.S. Cl.
CPC ............... *H05K 3/12* (2013.01); *B60S 1/026* (2013.01); *B64C 1/1492* (2013.01)

(58) Field of Classification Search
CPC ......... B60S 1/026; B64C 1/1492; H05B 3/00; H05K 3/12
USPC ....... 219/481, 522, 543, 509, 497, 494, 501, 219/505, 203, 547, 541; 361/104; 204/192.1, 192.11, 192.12, 192.29, 204/298 MS, 298 TT, 298.06, 298.11, 204/298.29; 118/504, 505
See application file for complete search history.

(56) References Cited

U.S. PATENT DOCUMENTS

| | | | | |
|---|---|---|---|---|
| 2,569,773 A | * | 10/1951 | Orr ........................ | H05B 3/84 219/543 |
| 2,689,803 A | * | 9/1954 | Ackerman ............... | H05B 3/84 427/110 |
| 3,762,902 A | | 10/1973 | Wagner et al. | |
| 3,982,092 A | * | 9/1976 | Marriott .................. | H05B 3/84 219/203 |
| 4,078,107 A | | 3/1978 | Bitterice et al. | |
| 4,536,645 A | * | 8/1985 | Mio ........................ | H05B 3/16 219/216 |
| 4,584,721 A | * | 4/1986 | Yamamoto ............... | B62J 50/15 2/424 |

(Continued)

FOREIGN PATENT DOCUMENTS

| | | |
|---|---|---|
| EP | 0349915 A1 | 1/1990 |
| EP | 0367210 A2 | 5/1990 |

(Continued)

*Primary Examiner* — Helena Kosanovic
*Assistant Examiner* — Ket D Dang
(74) *Attorney, Agent, or Firm* — Neil J Friedrich (57) ABSTRACT

A transparency includes a substrate having a first surface, an opposing second surface, and a peripheral edge extending therebetween. The transparency also includes a conductive coating covering a portion of the first surface. The conductive coating includes a first region having a first power density and a second region having a second power density different from the first power density.

16 Claims, 7 Drawing Sheets

(56) References Cited

U.S. PATENT DOCUMENTS

| | | |
|---|---|---|
| 4,610,771 A | 9/1986 | Gillery |
| 4,621,249 A | 11/1986 | Uchikawa et al. |
| 4,623,389 A | 11/1986 | Donley et al. |
| 4,793,175 A | 12/1988 | Fedter et al. |
| 4,806,220 A | 2/1989 | Finley |
| 4,829,163 A | 5/1989 | Rausch et al. |
| 4,894,513 A * | 1/1990 | Koontz ............ B32B 17/10036 219/203 |
| 4,894,514 A | 1/1990 | Delvin |
| 4,902,875 A | 2/1990 | Koontz |
| 4,939,348 A | 7/1990 | Criss |
| 4,988,424 A | 1/1991 | Woodward et al. |
| 4,994,650 A | 2/1991 | Koontz |
| 5,504,307 A * | 4/1996 | Hayashi .................. C09K 5/06 219/535 |
| 5,675,944 A | 10/1997 | Kerr et al. |
| 5,821,001 A | 10/1998 | Arbab et al. |
| 6,284,377 B1 * | 9/2001 | Veerasamy ............ B05D 5/083 428/408 |
| 6,417,491 B1 * | 7/2002 | Taniuchi .................. H05B 3/84 219/211 |
| 6,535,126 B2 | 3/2003 | Lin et al. |
| 8,082,979 B2 | 12/2011 | Greiner et al. |
| 8,155,816 B2 | 4/2012 | Rashid et al. |
| 8,288,678 B2 * | 10/2012 | Brandt ................ B23K 26/037 219/121.67 |
| 8,383,994 B2 | 2/2013 | Rashid et al. |
| 9,988,707 B2 | 6/2018 | Uprety et al. |
| 10,063,047 B2 | 8/2018 | Duarte et al. |
| 2003/0127452 A1 | 7/2003 | Gerhardinger et al. |
| 2004/0065651 A1 * | 4/2004 | Voeltzel ............ B32B 17/10036 219/203 |
| 2007/0002422 A1 | 1/2007 | O'Shaughnessy |
| 2010/0213183 A1 * | 8/2010 | Schall ...................... H05B 3/84 219/203 |
| 2012/0228641 A1 * | 9/2012 | Thoumazet ............. H02S 40/20 257/79 |
| 2013/0075531 A1 | 3/2013 | Jiao et al. |
| 2017/0022630 A1 * | 1/2017 | Lu ........................ C30B 11/003 |

FOREIGN PATENT DOCUMENTS

| | | |
|---|---|---|
| GB | 1401497 A | 7/1975 |
| WO | 2013048698 A1 | 4/2013 |
| WO | 2014002218 A1 | 1/2014 |

* cited by examiner

AIRCRAFT WINDOW WITH VARIABLE POWER DENSITY HEATER FILM

FIELD OF THE INVENTION

This disclosure relates to transparencies including a conductive coating covering a surface thereof, the coating having regions with different power densities, and to methods of applying the conductive coatings to substrates of the transparencies.

BACKGROUND OF THE INVENTION

Aircraft windshields and passenger windows include defogging/deicing systems for heating surfaces of the windshield and windows to remove moisture and to improve visibility. Such defogging/deicing systems can include transparent or semi-transparent conductive and resistive coatings or films electrically connected to a heater or power source and configured to produce heat when electrical current passes through the coating or film.

A variety of different materials are known for producing such transparent conductive coatings that can be used with window heating systems. Some windows include a thin film of a conductive metal oxide, such as indium tin oxide (ITO). ITO is a transparent and conductive metal oxide that includes indium, tin and oxygen. Indium tin oxide may be formed on a substrate by sputtering from a target. The target can be stationary relative to the substrate during the sputtering or can move across a surface of the substrate according to a predetermined pattern.

In order to apply power to a conductive (e.g., ITO) coating, the coating can be electrically connected to the power source through a heating system including bus bars and wire leads. The power source can be a direct current (DC) or alternating current (AC) power source. The power source for applying power to the conductive coating can be the same DC power source that is available on the aircraft for powering other systems, such as avionic systems. When power (e.g., DC power or AC power) is applied to the coating, the coating can heat up to a temperature which depends on a resistance or power density of the coating or film. The coating or film and electronics, such as the bus bars, are generally configured to produce even heating across a surface of the window or transparency.

SUMMARY OF THE INVENTION

The invention includes a transparency having a substrate comprising a first surface, an opposing second surface, and a peripheral edge extending therebetween. The transparency further comprises a conductive coating covering a portion of the first surface, wherein the conductive coating comprises a first region having a first power density and a second region having a second power density different from the first power density.

The invention also includes a method for making a heatable window, comprising: providing a substrate comprising a first surface, an opposing second surface, and a peripheral edge extending therebetween; and applying a conductive coating to the first surface of the substrate. The conductive coating comprises a first region having a first power density and a second region having a second power density different than the first power density, when an electric current is supplied to the conductive coating.

The invention also includes a window heating system comprising a transparency. The transparency comprises a substrate comprising a first surface, an opposing second surface, and a peripheral edge extending therebetween. The transparency further comprises a conductive coating covering a portion of the first surface, wherein the conductive coating comprises a first region having a first power density and a second region having a second power density different from the first power density. The window heating system further comprises a conductive bus bar system comprising a bus bar electrically coupled to a portion of the conductive coating; and a power source electrically connected to the bus bar configured to provide power to the conductive coating through the bus bar. Applying power from the power source to the conductive coating causes the first region of the conductive coating to increase in temperature to a first temperature and causes the second region of the conductive coating to increase in temperature to a second temperature, which is greater than the first temperature.

BRIEF DESCRIPTION OF THE DRAWINGS

These and other features and characteristics of the present disclosure, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only, and are not intended as a definition of the limit of the invention.

Further features, aspects, and advantages of the invention will become apparent from the following detailed description made with reference to the drawings in which.

DETAILED DESCRIPTION OF THE INVENTION

For purposes of the following detailed description, it is to be understood that the invention may assume various alternative variations and step sequences, except where expressly specified to the contrary. Moreover, other than in any operating examples, or where otherwise indicated, all numbers used in the specification and claims are to be understood as being modified in all instances by the term "about."

Accordingly, unless indicated to the contrary, the numerical parameters set forth in the following specification and attached claims are approximations that may vary depending upon the desired properties to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include any and all sub-ranges between and including the recited minimum value of 1 and the recited maximum value of 10, that is, all subranges beginning with a minimum value equal to or greater than 1 and ending with a maximum value equal to or less than 10, and all subranges in between, e.g., 1 to 6.3, or 5.5 to 10, or 2.7 to 6.1.

As used herein, the singular form of "a", "an", and "the" include plural referents unless the context clearly dictates otherwise.

As used herein, the terms "right", "left", "top", "bottom", and derivatives thereof shall relate to the invention as it is oriented in the drawing figures. However, it is to be understood that the invention can assume various alternative orientations and, accordingly, such terms are not to be considered as limiting. Also, it is to be understood that the invention can assume various alternative variations and stage sequences, except where expressly specified to the contrary. It is also to be understood that the specific devices and processes illustrated in the attached drawings, and described in the following specification, are examples. Hence, specific dimensions and other physical characteristics related to the embodiments disclosed herein are not to be considered as limiting.

With reference to the drawings, the present disclosure is directed to a transparency including a conductive coating which, when electric current is applied thereto, increases in temperature. As used herein, a "transparency" can refer to a window, windshield, panel, or similar structure formed from one or more substrates. The substrates can be sheets, layers, interlayers, molded articles, or similar structures. A transparency can be a window of an aircraft or another vehicle. A transparency can be a fully transparent or clear, allowing substantially 100% of visible radiation to pass through. The transparency can also be partially transparent, allowing 10%, 50%, 75%, or any desired amount of visible radiation to pass through the transparency. The transparency can also be substantially or partially opaque, allowing less than 5% of visible radiation to pass through the transparency.

The conductive coatings described herein can be used in window heating systems configured to prevent moisture, fog, or ice from accumulating on a surface of the window or transparency. The conductive coatings described herein can be configured such that certain selected portions of the coating heat to a higher temperature than other portions. The conductive coatings can be configured or designed such that, when an electric current is applied to the conductive coating, portions of the transparency or window most likely to be affected by moisture are heated to a higher temperature than other portions of the transparency. As a result of such targeted applied heat, the conductive coatings described herein are better able to fully defog the transparency than if the coating applied uniform heat across the surface of the transparency or window.

Transparency and Conductive Coating

Figure 1:
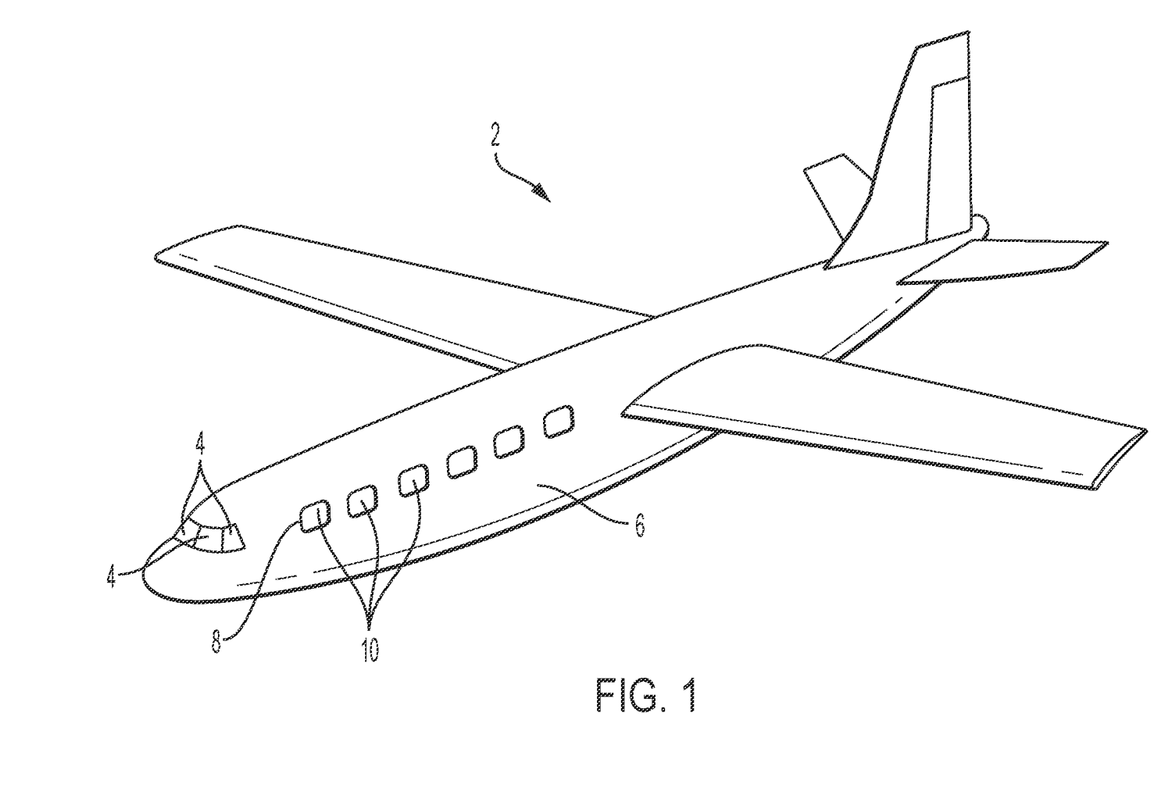
FIG. 1 is a schematic drawing of an aircraft including a windshield and passenger windows coated with the conductive coating with variable power density.

With reference to FIG. 1, a winged aircraft 2, which can include the transparencies and heating systems of the present invention, includes one or more windshields 4 positioned adjacent the fore or front end thereof. Each windshield 4 desirably has a form that conforms to the shape of the corresponding aircraft 2 where each windshield 4 is installed. To facilitate attachment to the aircraft 2, each windshield 4 includes a support frame 6 that surrounds the windshield and provides a mechanical interface between the windshield 4 and the body of aircraft 2 for connecting windshield 4 to aircraft 2. The aircraft 2 also includes a plurality of passenger windows 8 arranged side-by-side extending along the fuselage of the aircraft 2. As described herein, the windshield 4 and/or passenger windows 8 can include a coating covering a portion of a surface of the window 8 or windshield 4 for heating the surface of the windshield 4 and/or window 8. As used herein, a coating can be a layer, film, membrane, or laminated material applied to a surface of the windshield 4 or window 8 by any convenient process or technique, such as spraying or painting. The coating can be applied prior to mounting the windshield 4 or window 8 to the aircraft 2 or after the windshield 4 or window 8 is in place on the aircraft 2.

The windshields 4 or windows 8 shown in FIG. 1 can each include one or more transparencies 10 connected to the aircraft frame 6. The transparencies 10 described herein can also be used as windows for other applications including windows for other types of vehicles, such as land vehicles (e.g., trucks, busses, trains, or automobiles) or water vehicles (e.g., boats or submarines). The transparencies 10 described herein can also be used for providing windows for buildings, such as residential buildings or commercial buildings.

Figure 2A:
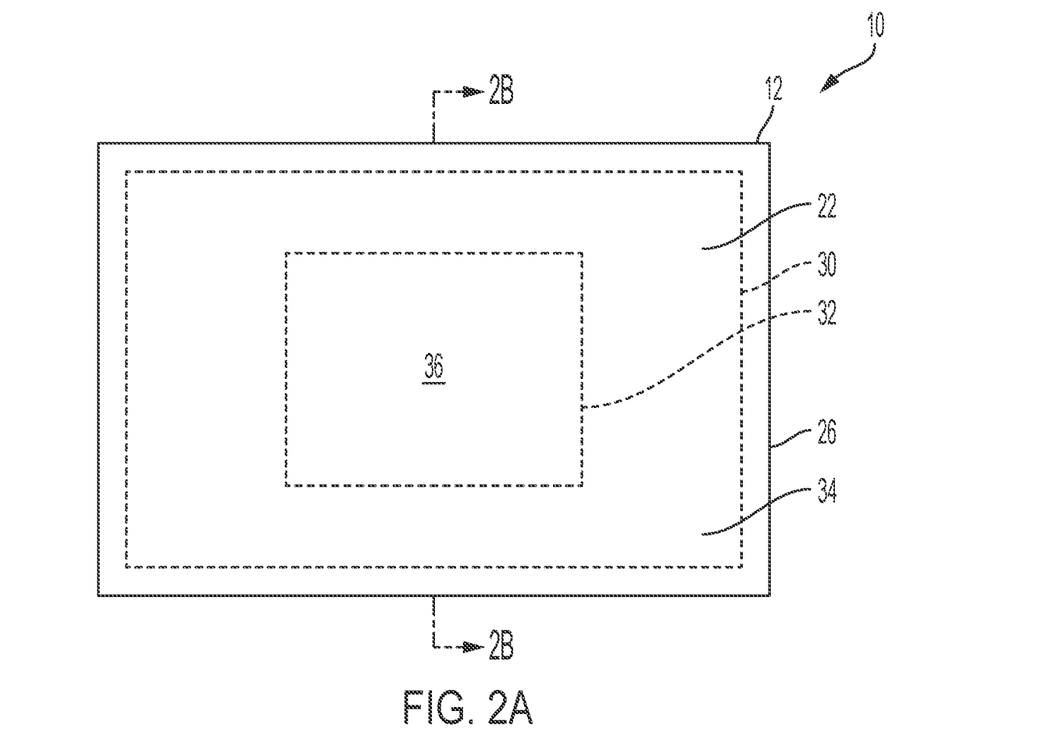
FIG. 2A is a top view of a transparency including a conductive coating with a variable power density.
Figure 2B:
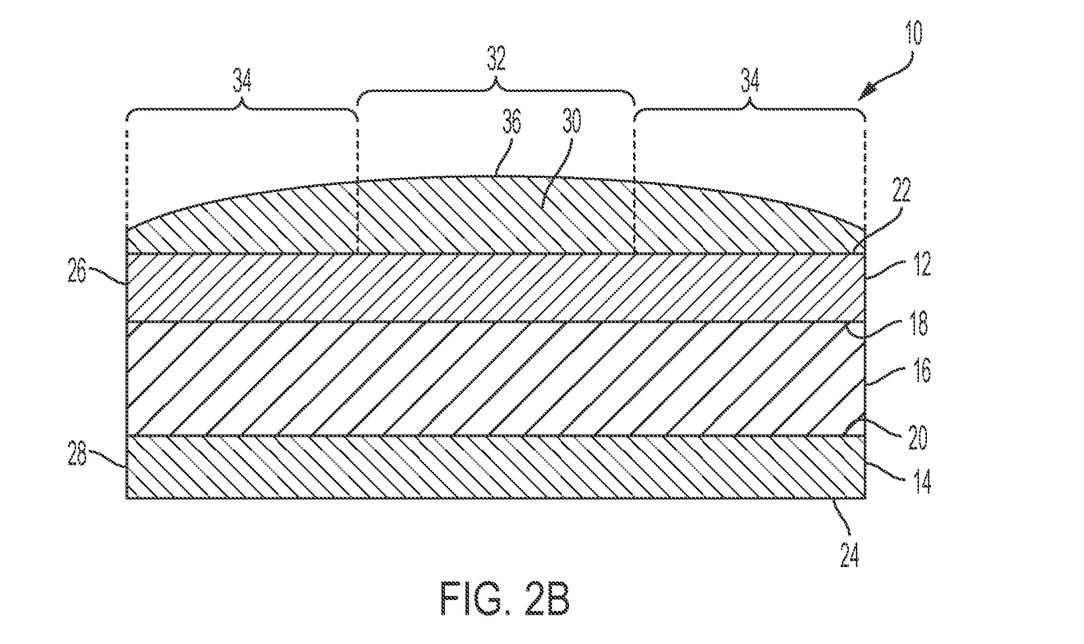
FIG. 2B is a cross-sectional view of the transparency of FIG. 2A taken along line 2B-2B.

A transparency 10 including features of the present disclosure is shown in FIGS. 2A and 2B. The transparency 10 can include a substrate, such as two or more laminated substrates. The transparency 10 shown in FIGS. 2A and 2B includes a first substrate 12, a second substrate 14, and an interlayer 16 between the substrates 12, 14. The substrates 12, 14 include a first or inner surface 18, 20, an opposing second or outer surface 22, 24, and a peripheral edge 26, 28 extending therebetween. The first substrate 12 and the second substrate 14 can be formed from plastic materials, such as polycarbonates, polyurethanes (including Opticor™ manufactured by PPG Industries Ohio, Inc.), polyacrylates, polyalkylmethacrylates, stretched acrylic, or polyalkylterephthalates, such as polyethyleneterephthalate (PET), polypropyleneterephthalates, and/or polybutyleneterephthalates. The substrates 12, 14 can also be formed from glass materials, such as conventional soda-lime-silicate glass (the glass can be annealed, heat-treated, thermally tempered, or chemically tempered glass). The substrates 12, 14 can also be formed from combinations of polymer and glass materials. The interlayer 16 can be formed from a softer plastic material, such as polyvinyl butyral or polyurethane.

The transparency 10 also includes a conductive coating 30 covering a portion of a surface 18, 20, 22, and/or 24 of one of the substrates 12, 14. The coating 30 can be a transparent conductive coating or a transparent conductive mesh. The conductive coating 30 can be applied to an outer surface 22, 24 of the substrates 12, 14. The conductive coating 30 may also be applied between an inner surface 18, 20 of one of the substrates 12, 14 and the interlayer 16. The conductive coating 30 can be formed from a conductive metal oxide, such as ITO, aluminum doped zinc oxide, fluorine doped tin oxide, tin oxide, antimony doped tin oxide, and others. The conductive coating 30 can also be formed from a conductive metal, such as a noble metal. The conductive metal can be gold, silver, antimony, palladium, platinum, and others. The conductive coating 30 can further include metal oxides, doped metal oxides, or anti-reflective layers to reduce reflection of conductive metals. The conductive coating 30 can include a plurality of dielectric layers and a metallic layer.

As described herein, the conductive coating 30 can be applied to at least one of the surfaces 18, 20, 22, and/or 24 of the substrate 12, 14 to provide targeted heating for selected portions of the substrate 12, 14. The conductive coating 30 can be configured to heat selected regions of the transparency 10 to a higher temperature than other regions of the transparency 10. In particular, the coating 30 may be configured such that portions of the substrate 12, 14, which are more likely to fog or where moisture or ice are most likely to form, are warmed to higher temperatures than other portions of the transparency 10. Portions of the substrates 12, 14, which are less susceptible to fogging or icing, can be configured to be heated to a lower temperature. It is believed that heating different portions of the conductive coating 30 to different temperatures conserves power compared to when the entire coating 30 heats to a uniform high temperature. Particularly, power is conserved because low temperature areas of the coating 30 use less power than high temperature areas of the coating 30.

One way to control the temperature and power required to heat different portions of the conductive coating 30 to different temperatures is based on power density (watts/in$^2$) of different regions of the conductive coating 30. As shown in FIGS. 2A and 2B, the conductive coating 30 can include a first region 32 having a first power density and a second region 34 having a second power density. A power density of the second region 34 may be from about 1% to about 400% greater than a power density of the first region 32. Alternatively, the power density of the second region can be from about 10% to about 200%, or from about 20% to about 100% greater than the power density of the first region 32. The first region 32 may have a power density of from 0.1 watt/in$^2$ to 4.0 watt/in$^2$ and the second region may have a power density of 0.5 watt/in$^2$ to 5.5 watt/in$^2$. In other cases, the first region 32 may have a power density of from 0.1 watt/in$^2$ to 1.0 watt/in$^2$, and the second region 34 may have a power density of greater than the power density of the first region 32.

The first region 32 of the conductive coating 30 can be positioned or configured to cover a central or viewing portion of the transparency 10, as shown in FIG. 2A. In that case, the second region 32 of the conductive coating 30 can cover a peripheral portion of the transparency 10 near the peripheral edge 26, 28 of the substrate 12, 14. In some cases, the second region 34 can entirely enclose or surround the first region 32, as shown in FIG. 2A. Alternatively, the second region 34 may extend along one side of the substrate 12, 14. The second region 34 may extend along one edge of the substrate 12, 14 to heat the bottom portion of the transparency 10 (as it is oriented in the aircraft 2). Peripheral portions of the coating 30 may be heated to a higher temperature than the central portion, since moisture often collects near the edges of a window or transparency. Water may also collect at an interface between the transparency 10 and the aircraft support frame 6.

As described herein, one way to control power density of a continuous film is by adjusting a thickness of the coating 30. One example of non-limiting differences in coating thickness between the first region 32 and the second region 34 are shown in FIG. 2B. Generally, electrical current passes through thicker portions of a coating 30 or film more easily than through thinner portions of the film. Therefore, in order for peripheral portions of the conductive coating 30 to heat to a higher temperature than more central portions thereof, peripheral portions of the coating 30 may be thicker than central portions of the coating 30. Generally, thicknesses of the different regions of the coating 30 are selected based on a desired temperature of the coating 30, when electrical current is applied thereto. Considerations including how much power is required to heat the coating 30, as well as material costs and manufacturing time required to produce the coating 30, may also be relevant for selecting the coating thickness. For an ITO coating, a central portion (e.g., the first region 32) of the coating 30 can be from 100 nm to 3000 nm thick, or from 200 nm to 2000 nm thick. For an ITO conductive coating, a thickness of the thinner second region 34 can be from 100 nm to 2000 nm or from 200 nm to 1000 nm. For a sputtered gold conductive coating, the central portion (e.g., the first region 32) of the coating 30 can be from 1.0 nm to 20 nm thick, from 2 nm to 14 nm thick, or from 3 nm to 9 nm thick. The thinner second region 34 of the conductive coating 30, for a gold sputtered conductive coating, can have a thickness of from 1 nm to 15 nm.

The conductive coating 30 can be formed by applying multiple layers of the conductive material (e.g., the ITO) to a surface 18, 20, 22, and/or 24 of the substrate 12, 14. Therefore, in order to obtain the desired differences in power density, some portions of the conductive coating 30 can include more layers than other portions of the coating 30. As described herein, layers can be formed by passing a sputtering target over the substrate to apply the conductive material to the substrate 12, 14. In that case, the pattern for moving the target can be selected to apply more layers to central portions of the substrate 12, 14 (e.g., to portions of the substrate that should remain at lower temperatures) and to apply fewer layers of the conductive material to portions of the substrate 12, 14 that should remain at higher temperatures.

Rather than having discrete regions with different thicknesses and power densities, the conductive coating 30 can be a gradient coating. A center 36 of the conductive coating 30 can be a thickest point or a thinnest point of the conductive coating 30. The coating 30 can become progressively thinner or progressively thicker as radial distance from the center 36 increases. The power density of the coating 30 can increase linearly or decrease linearly based on distance from the center 36. The power density of the coating 30 could also increase parabolically, logarithmically, or according to any other pattern, based on distance from the center 36 of the coating 30. For a gradient coating, the gradient can extend from one portion of the coating 30 to another portion of the coating 30. The coating 30 can be thickest along a top portion of the coating 30 and can decrease linearly or according to some other pattern towards a bottom portion of the coating 30.

Figure 3:
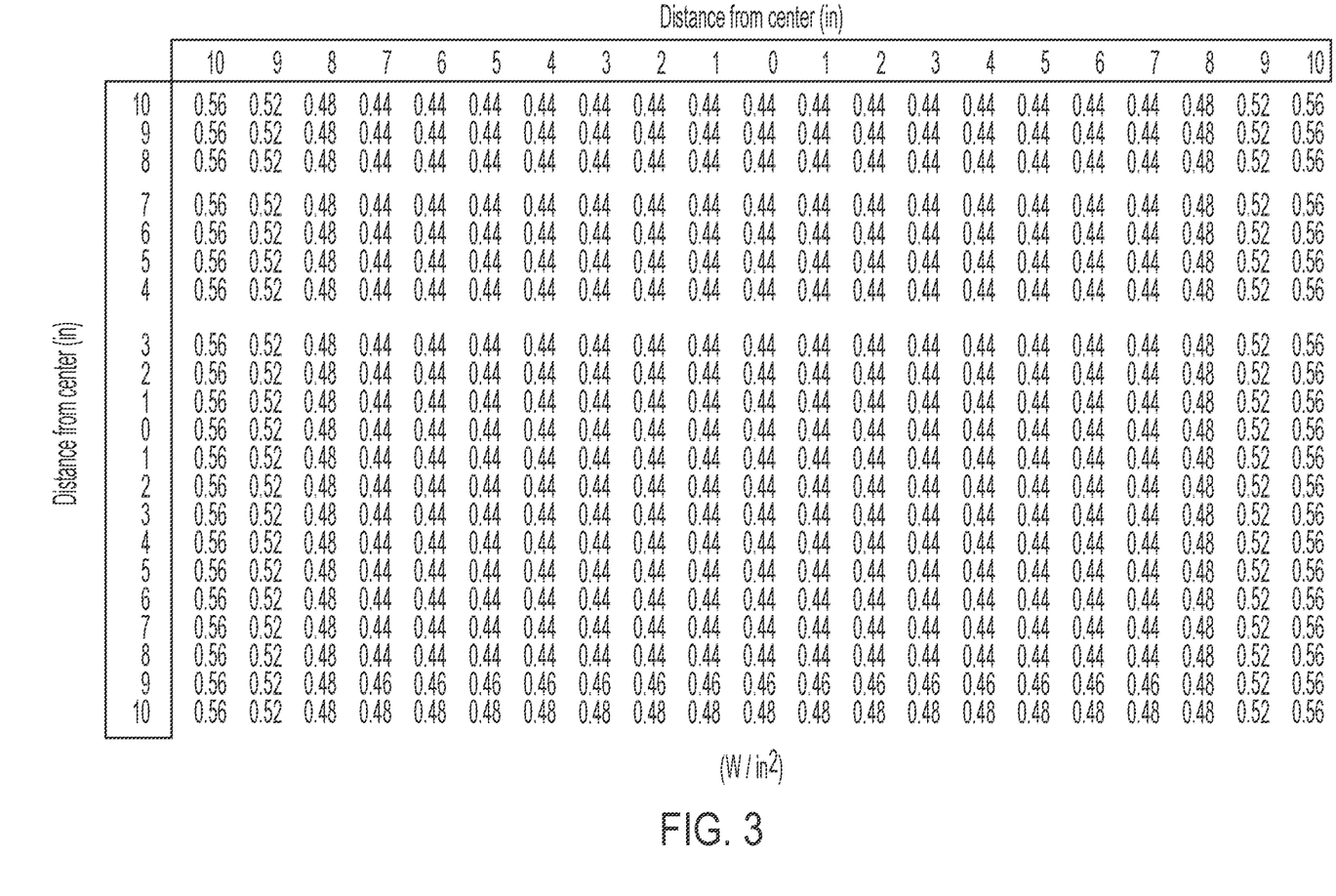
FIG. 3 is an exemplary power map listing power density values for different portions of a window.
Figure 4:
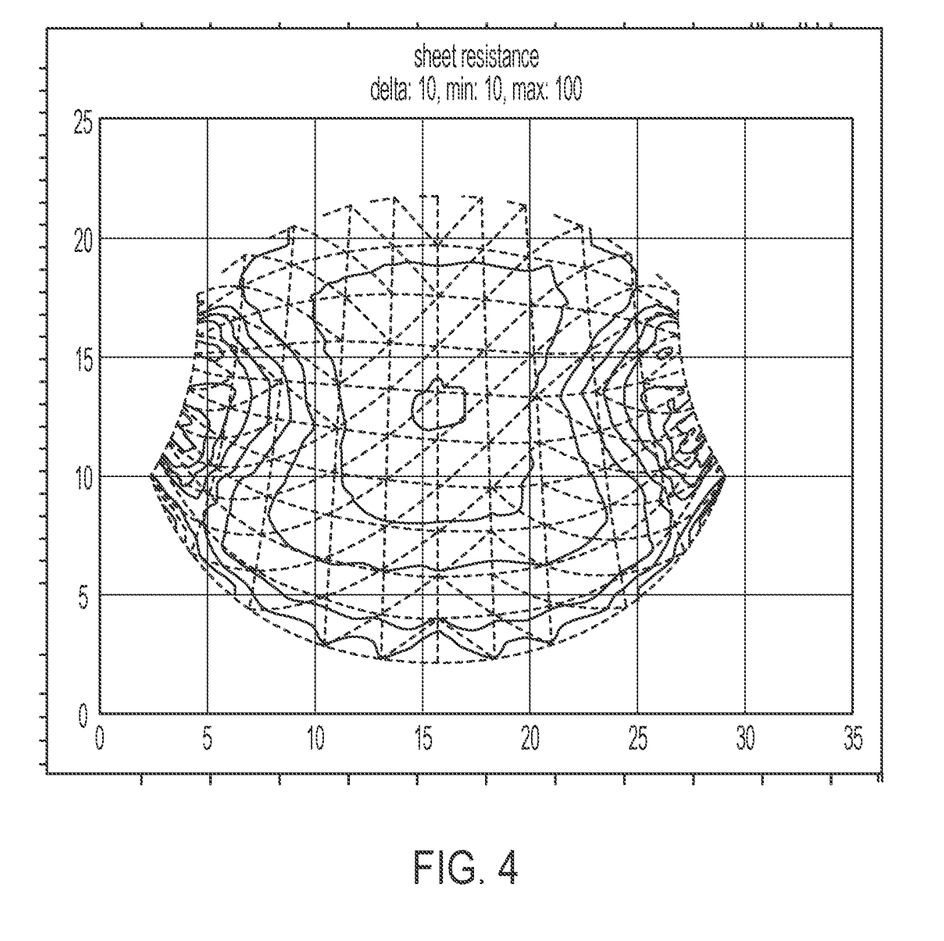
FIG. 4 is a graph showing regions of the transparency including similar power density values.

One example of a power map showing power density values for different regions of a conductive coating 30 of an aircraft transparency is shown in FIG. 3. The power map includes a central region having a power density of 0.44 watt/in$^2$. The power density gradually increases towards the right side and the left side of the transparency. The power density at the side edges of the transparency is 0.56 watts/ in². The power density of the top edge of the transparency ranges from 0.56 watts/in² (near the right and left sides of the transparency) to 0.44 watts/in² near the center of the top portion of the transparency. As discussed herein, generally moisture accumulates near the bottom edge of the transparency. Therefore, bottom portions of the transparency, shown in the power map, have a higher power density ranging from 0.56 watt/in² in the corners of the transparency to 0.48 watt/in² near the center of the transparency. A line graph showing power density regions for the power map of FIG. 3 is shown in FIG. 4. As shown in FIG. 4, the transparency includes a middle region with lower power density values. The power density increases most steeply near the right and left sides and bottom of the transparency as shown by the contour lines in FIG. 4.

Window Heating Systems

Figure 5:
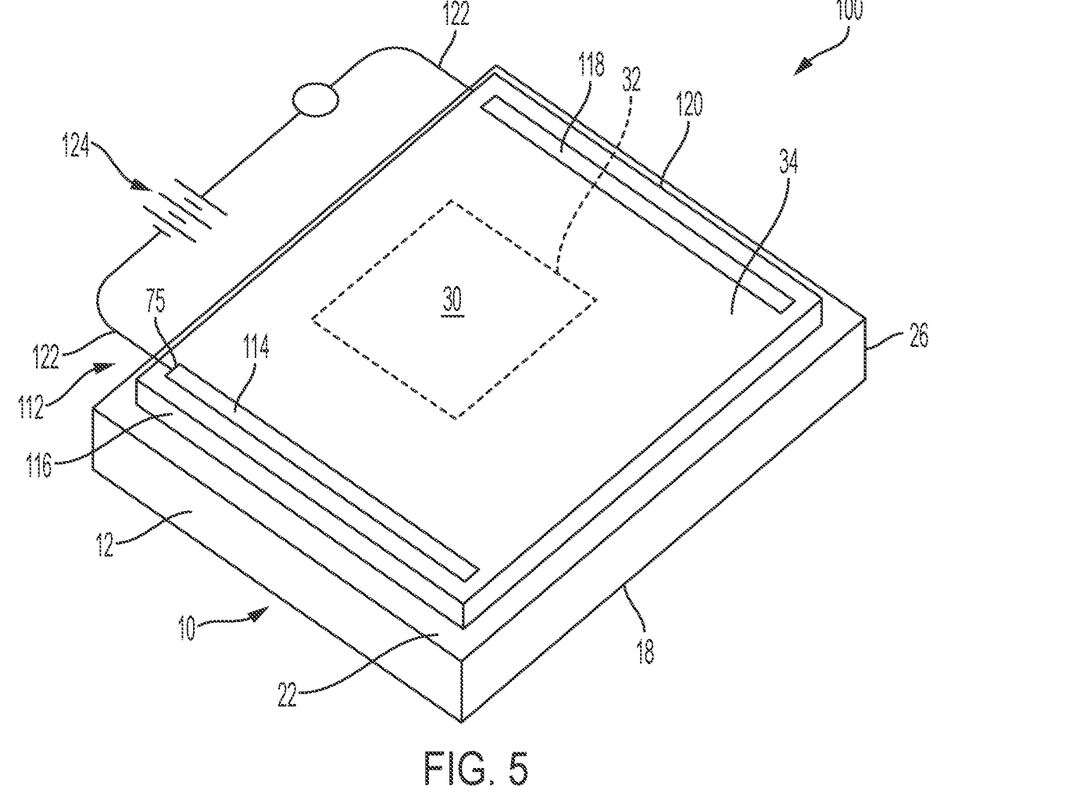
FIG. 5 is a perspective view of a transparency and heater assembly.
Figure 6:
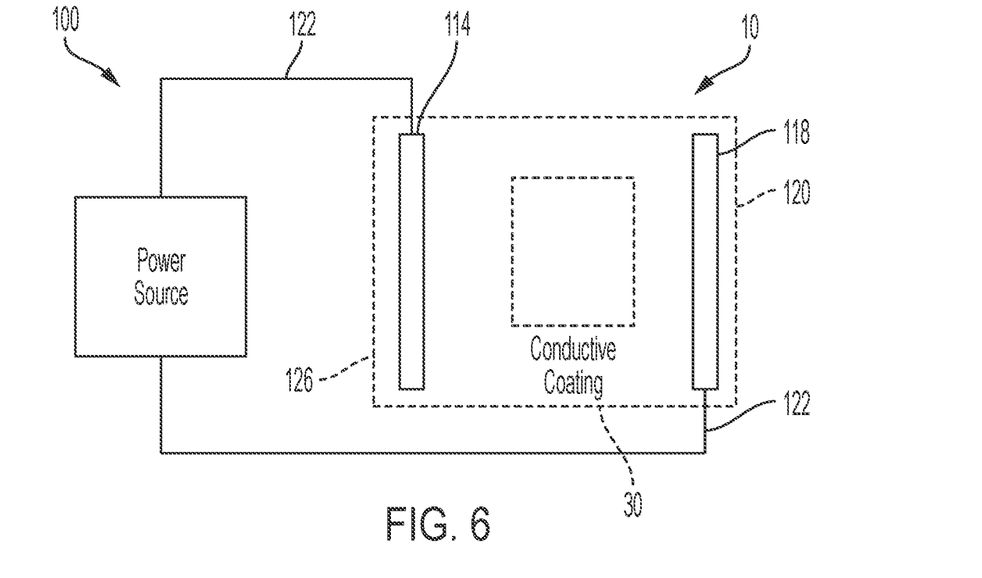
FIG. 6 is a schematic drawing of electrical circuitry for providing power to the transparency and heater assembly of FIG. 5.

With reference to FIGS. 5 and 6, the transparencies 10 described herein can be used with a window heating system 100 for controlling flow of electrical current through the conductive coating 30 of the transparency 10. The window heating system 100 includes the transparency 10 and conductive coating 30 as described in connection with FIGS. 2A and 2B. The system 100 also includes a conductive bus bar system 112 including a first bus bar 114 positioned along a first edge 116 of the substrate 12 and a second bus bar 118 positioned along an opposing edge 120 of the substrate 12. As is known in the art, the bus bars 114, 118 can be positioned on top of the conductive coating 30 or film and can be electrically connected to the coating 30 or film by a conductive adhesive or conductive tape, as are known in the art.

The system 100 can also include leads 122, such as wire leads, connected to and extending from the bus bars 114 by solder or similar conductive adhesives. The leads 122 extend from the bus bars 114, 118 to a power source 124, which can also be referred to as a heater or heater system. The power source 124 can be configured to provide an electrical current to the conductive coating 30 or film. The power source 124 can be configured to receive information from one or more temperature sensors (not shown) positioned on the transparency 10. When a measured temperature of the transparency 10 and/or on a surface of the transparency 10 exceeds a predetermined value, the power source 124 can be configured to cease applying electrical current to the bus bars 114, 118 and conductive coating 30 or film.

Manufacturing Methods

Having described various exemplary transparencies and window heating systems including transparencies with variable power density conductive coatings, methods for producing a transparency having a variable power density coating or film will now be described. A process for producing a transparency includes providing a suitable substrate, such as a plastic substrate or panel. As previously described, the substrate can include a first surface, an opposing second surface, and a peripheral edge extending therebetween. Once a suitable substrate is obtained and prepared for processing, a conductive coating is applied to the substrate surface. The conductive coating can be applied to a surface by a sputtering process, such as the sputtering process described at column 2, line 55 to column 3, line 36 of U.S. Pat. No. 4,988,424 entitled "Mask and method for making gradient sputtered coatings." During a sputtering process, a stream of a conductive material is directed to a surface of the substrate by an electrical charge, thereby depositing layers of the conductive material on a surface of the substrate to form a coating or film. In order to achieve the benefits of variable power density as described herein, the conductive coating can be formed to include a first region having a first thickness and a second region having a second thickness.

Figure 7:
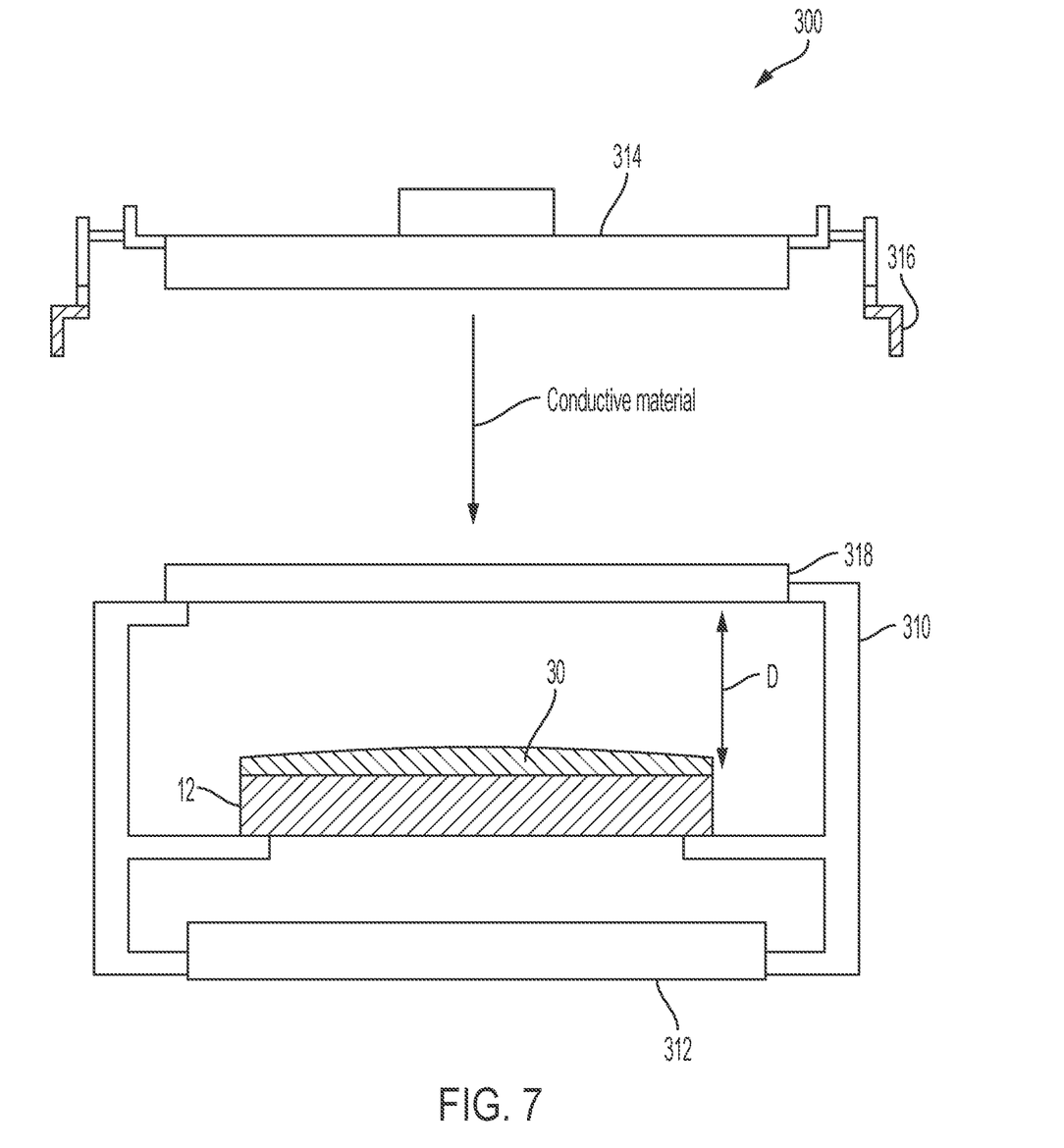
FIG. 7 is a schematic drawing of a process for applying a conductive coating to a surface.

In order to form the conductive coating with variable power density, the sputtering process includes techniques for controlling the amount of conductive material deposited on different portions of the surface of the substrate. As described herein, central portions of the coating may be formed to be thicker than peripheral portions of the coating. An exemplary apparatus 300 for applying a sputter coating of variable power density to a substrate 12 is shown schematically in FIG. 7. As shown in FIG. 7, the substrate 12 is mounted to a fixture or frame 310, which may be formed of a metal substrate with the center cut out in an outline of the substrate 12. If the substrate 12 is curved, the fixture or frame 310 may also be provided with a corresponding curvature. The fixture or frame 310 is designed so that the substrate 12 can be exposed to heating elements 312 below the fixture or frame 310. The heating elements 312 may be electric resistance heating elements provided to maintain the substrate 12 at a proper temperature for sputter coating. On the opposite side of the substrate from the heating elements 312 is a cathode assembly 314 mounted for reciprocation over the substrate 12 by way of a wheel and rail assembly 316. The cathode assembly 314 carries a cathode target of the metal (e.g., ITO) that is to be sputtered as well as an anode. The entire apparatus 300 can be enclosed within a vacuum chamber (not shown) during sputtering.

As shown in FIG. 7, the conductive material (e.g., the ITO) passes from the cathode assembly 314 through a mask 318, which is mounted on the frame 310 by means of brackets 320. The mask 318 controls an amount of conductive material that is deposited on different portions of the substrate 12 surface, thereby controlling a thickness and power density of the conductive coating 30. The mask 318 can be made of any material that can withstand the temperature and chemical conditions of the sputtering operation, and which has a defined porosity that can handle working temperatures used in deposition. The mask 318 can be made from metal due to its rigidity at the working temperatures involved and ease of use. Suitable metals for the mask 318 include stainless steel, copper, and titanium, and other metals may also be suitable. The mask 318 can be formed from 16-gauge stainless steel.

The mask 318 is spaced from the substrate 12 by a distance D. The distance D can vary based on a sharpness of the image of the mask 318 that is to be reproduced in the coating 30 deposited on the substrate 12. In order to create a sharply focused line between thickly and thinly coated areas, the mask 318 is spaced a relatively short distance from the surface of the substrate 12. When a less distinct line or gradient between regions of the coating 30 is desired, the mask 318 can be spaced farther from the substrate 12. The distance D can range from about 0.5 inch to about 5.0 inches.

The mask 318 is a porous structure including a plurality of holes or openings 320, 330 extending through the mask 318 positioned to control a stream of conductive material, so that a desired amount of material is deposited at different regions of the substrate 12 or substrate. Regions of the coating 30 intended to heat to higher temperatures (e.g., hot regions) should have thinner conductive coatings. Therefore, holes or openings of portions of the mask 318 that form such hot regions should be fewer in number, spaced farther apart, and/or be smaller than holes of other regions of the mask 318. Regions of the conductive coating 30 intended to remain at lower temperatures (e.g., low temperature regions) should have a thicker conductive coating. Therefore, portions of the mask 318 that form such low temperature regions should have a greater number of openings or holes to permit formation of thicker portions of the conductive coating 30.

While the processes described herein are not intended to be limited to any particular opening shapes and size, exemplary opening suitable shapes for chemical deposition including circular, diamond, square, hexagonal, and other hole shapes. The amount of open space for the plurality of holes or openings depends upon the effect desired. In general, the base material of the mask 318 can have at least forty percent of its area open. Configurations of holes or openings include rectangular holes sized from 0.25 inch by 0.5 inch up to 1.0 inch by 2.0 inches. Opening sizes can be from 0.080 inch to 0.25 inch for circular holes, 0.75 inch in the long direction for diamond-shaped holes, and from 0.25 inch to 1.00 inch for hexagonal holes.

Figure 8:
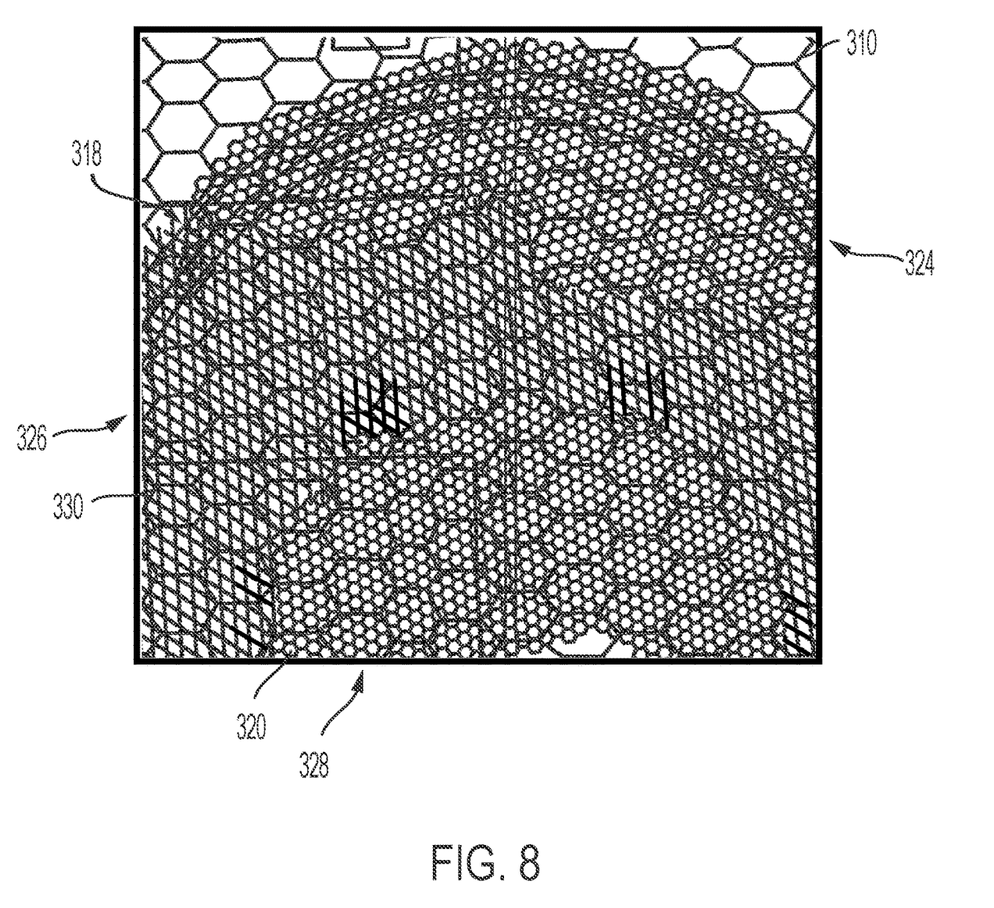
FIG. 8 is a schematic drawing of a porous mask for controlling deposition of charged particles on a surface of the transparency.

A schematic drawing of a portion of an exemplary mask 318, which can be used for forming an embodiment of a conductive coating 30, is shown in FIG. 8. The mask 318 in FIG. 8 is mounted to a mesh frame 310 for positioning the mask 318 a desired distance from the substrate. The mask 318 is configured to produce a coating 30 having regions 324, 326, 328 with different thicknesses. The mask 318 can include a first region 324 and a third region 328 having a plurality of circular holes or openings 320. The first and third regions 324, 328 are sized to produce thinner regions of the conductive coating 30. The circular holes or openings 320 of the first and third regions 324, 328 can be formed by any convenient technique including stamping the holes or openings 320 into a flat substrate formed from a rigid metal material. The mask 318 also includes a second region 326, between the first region and the third region 324, 328. The second region 326 can be formed from a mesh of interconnected elongated members or tines forming diamond shaped openings 330. The holes or openings 330 of the second region 326 are larger than the openings 320 of the first and third regions 324, 326. Accordingly, the second region of the mask 318 forms thicker portions of the conductive coating 30.

The above-described sputtering processes for forming the conductive coating are examples of a suitable process for forming a conductive coating 30 with a variable power density. Other processes, as are known in the art, can also be used for forming conductive coatings 30 of variable power density and/or thickness. A conductive coating 30 may also be formed by controlled movement of the target and/or the substrate according to a predetermined pattern so that different portions of the surface of the substrate are exposed to different amounts of conductive material. Controlled movement of the target can include varying target speed (e.g., speeding up or slowing down movement of the target across a surface of the substrate), target power (e.g., varying a voltage applied to the target and cathode), and/or target spacing (e.g., varying a distance between the target and substrate). Controlled movement of the target can be performed according to predetermined patterns to produce conductive coatings having desired thickness and power density variability to obtain the benefits of the current invention described herein. A process for forming a conductive coating of uniform or non-uniform thickness by moving of the target and/or substrate, which can be used in connection with the current invention, is described at column 4, lines 22-61 of U.S. Pat. No. 9,988,707 entitled "Transparent conducting indium doped tin oxide." The conductive coating can also be formed by variable speed robotic arms or other production methods as are known to those skilled in the art.

Whereas particular embodiments of this invention have been described above for purposes of illustration, it will be evident to those skilled in the art that numerous variations of the details of the present invention may be made without departing from the invention as defined in the appended claims.

In view of the foregoing description, the present invention thus relates inter alia to the subject matter of the following clauses though being not limited thereto.

Clause 1: A transparency comprising: a substrate comprising a first surface, an opposing second surface, and a peripheral edge extending therebetween; and a conductive coating covering a portion of the first surface, wherein the conductive coating comprises a first region having a first power density and a second region having a second power density different from the first power density.

Clause 2: The transparency of clause 1, wherein the first region heats to a first temperature when an electric current is applied to the coating, and the second region heats to a second temperature, greater than the first temperature, when the current is applied to the film.

Clause 3: The transparency of clause 1 or clause 2, wherein the first region of the conductive coating has a first thickness, and the second region of the conductive coating has a second thickness, which is less than the first thickness.

Clause 4: The transparency of any of clauses 1 to 3, wherein the first region comprises a central portion of the coating, and the second region comprises a peripheral portion of the coating extending along a portion of the peripheral edge of the substrate.

Clause 5: The transparency of any of clauses 1 to 4, wherein the first region comprises a central portion of the coating, and the second region comprises a peripheral portion of the coating enclosing the central portion of the coating.

Clause 6: The transparency of clause 5, wherein the central portion of the coating covers a viewing portion of the substrate.

Clause 7: The transparency of any of clauses 1 to 6, wherein the conductive coating comprises a gradient coating, positioned such that power density of the conductive coating increases according to radial distance from a center of the substrate.

Clause 8: The transparency of clause 7, wherein the power density increases or decreases linearly according to radial distance from the center of the substrate.

Clause 9: The transparency of any of clauses 1 to 8, wherein the conductive coating comprises a plurality of layers deposited on the first surface of the substrate.

Clause 10: The transparency of clause 9, wherein the first region of the conductive coating comprises a greater number of layers of the plurality of layers than does the second region of the conductive coating.

Clause 11: The transparency of any of clauses 1 to 10, wherein the substrate comprises one or more of a glass material and a polymeric material.

Clause 12: The transparency of any of clauses 1 to 11, wherein the substrate comprises a first substrate comprising an outer surface and an opposing inner surface, a second substrate opposite the first substrate comprising an outer surface and an opposing inner surface, and an interlayer positioned between the inner surface of the first substrate and the inner surface of the second substrate.

Clause 13: The transparency of any of clauses 1 to 12, wherein the conductive coating comprises one or more metal oxides, one or more doped metal oxides, indium tin oxide, one or more anti-reflective layers, and/or a plurality of dielectric layers and a metallic layer.

Clause 14: A method for making a heatable window, comprising: providing a substrate comprising a first surface, an opposing second surface, and a peripheral edge extending therebetween; and applying a conductive coating to the first surface of the substrate, wherein the conductive coating comprises a first region having a first power density, and a second region having a second power density different than the first power density, when an electric current is supplied to the conductive coating.

Clause 15: The method of clause 14, wherein applying the conductive coating comprises performing a sputtering process in which a conductive material is directed to the first surface of the substrate under an electrical charge, thereby depositing the conductive material on the first surface of the substrate.

Clause 16: The method of clause 15, wherein the conductive material is directed from a target to the surface of the substrate through a porous mask comprising regions of differing porosity positioned to form the first region and the second region of the conductive coating.

Clause 17: The method of clause 16, wherein the region of the porous mask which forms the first region of the conductive coating is less porous than the region of the porous mask which forms the second region of the conductive coating.

Clause 18: The method of any of clauses 14 to 17, wherein applying the conductive coating to the first surface and/or the second surface comprises sputtering layers of the conductive coating to the first surface and/or the second surface.

Clause 19: The method of clause 18, wherein applying the conductive coating to the first surface and/or the second surface comprises applying a different number of layers to the first region than to the second region.

Clause 20: The method of clause 19, wherein applying a different number of layers to the first region than to the second region produces the conductive coating in which the first region is a different thickness than the second region.

Clause 21: A window heating system, comprising: the transparency of clause 1; a conductive bus bar system comprising a bus bar electrically coupled to a portion of the conductive coating; and a power source electrically connected to the bus bar configured to provide power to the conductive coating through the bus bar, wherein, applying power from the power source to the conductive coating causes the first region of the conductive coating to increase in temperature to a first temperature and causes the second region of the conductive coating to increase in temperature to a second temperature, which is greater than the first temperature.

Clause 22: The window heating system of clause 21, wherein the conductive bus bar system comprises: a first bus bar electrically connected to the conductive coating; and a second bus bar spaced apart from the first bus bar and positioned on the first surface of the substrate and electrically connected to the conductive coating, wherein the first bus bar and the second bus bar are electrically connected to the power source by leads, thereby creating an electrical circuit extending from the power source through the first bus, the conductive coating, and the second bus bar.

The invention claimed is:

1. A transparency comprising:
   a substrate comprising a first surface, an opposing second surface, and a peripheral edge extending therebetween; and
   a conductive coating covering a portion of the first surface,
   wherein the conductive coating comprises: a first region comprising a central viewing region of the transparency, the first region having a first power density and a first thickness; and a u-shaped second region around a right side, left side, and bottom of the first region, the u-shaped second region having a second power density and a second thickness, and
   wherein the first power density is less than the second power density and the first thickness is greater than the second thickness, and
   wherein, when an electrical current passes through the first region and the u-shaped second region of the conductive coating, the u-shaped second region heats to a temperature greater than the first region comprising the central viewing region of the transparency.

2. The transparency of claim 1, wherein the first region of the conductive coating comprises a gradient coating in which the first power density of the first region of the conductive coating increases gradually according to radial distance from a center of the substrate.

3. The transparency of claim 2, wherein the first power density increases linearly as the radial distance from the center of the substrate increases.

4. The transparency of claim 1, wherein the conductive coating comprises a plurality of layers deposited on the first surface of the substrate.

5. The transparency of claim 4, wherein the first region of the conductive coating comprises a greater number of layers of the plurality of layers than does the second region of the conductive coating.

6. The transparency of claim 1, wherein the substrate comprises a first substrate comprising an outer surface and an opposing inner surface, a second substrate opposite the first substrate comprising an outer surface and an opposing inner surface, and an interlayer positioned between the inner surface of the first substrate and the inner surface of the second substrate.

7. The transparency of claim 1, wherein the conductive coating comprises one or more metal oxides, one or more doped metal oxides, indium tin oxide, one or more anti-reflective layers comprising a noble metal, and/or a coating having a plurality of dielectric layers and a metallic layer.

8. A window heating system, comprising:
   the transparency of claim 1;
   a conductive bus bar system comprising at least two parallel bus bars electrically coupled to the u-shaped second region of the conductive coating; and
   a power source electrically connected to the at least two parallel bus bars configured to provide power to the conductive coating through the at least two parallel bus bars,
   wherein, applying power from the power source to the conductive coating causes electrical current to pass through portions of the u-shaped second region and through the first region, thereby causing the first region of the conductive coating to increase in temperature to a first temperature and causing the u-shaped second region of the conductive coating to increase in temperature to a second temperature, which is greater than the first temperature.

9. The window heating system of claim 8, wherein the conductive bus bar system comprises:
   a first bus bar directly electrically connected to the u-shaped second region of the conductive coating; and a second bus bar extending parallel to and spaced apart from the first bus bar directly electrically connected to the u-shaped second region of the conductive coating, wherein the first bus bar and the second bus bar are equidistantly spaced along an entire length of the first bus bar and/or second bus bar, and wherein the first bus bar and the second bus bar are electrically connected to the power source by leads, thereby creating an electrical circuit extending from the power source through the first bus bar, the conductive coating, and the second bus bar.

10. The window heating system of claim 9, wherein the first bus bar is positioned over a left-side portion of the u-shaped second region proximate to the left side of the first region and the second bus bar is positioned over a right-side portion of the u-shaped second region proximate to the right side of the first region, such that an electrical path for the electrical current between the first bus bar and the second bus bar passes through the left-side portion of the u-shaped second region, the first region, and the right-side portion of the u-shaped second region.

11. The transparency of claim 1, wherein the conductive coating is a transparent or semi-transparent conductive coating that allows at least 75% of visible radiation to pass through the transparency.

12. The transparency of claim 1, wherein the conductive coating comprises a continuous film in which the first region and the second region are continuous and electrically connected together.

13. The transparency of claim 1, wherein the conductive coating comprises indium tin oxide, the first thickness is from 200 nm to 2000 nm, and the second thickness is less than the first thickness and is from 200 nm to 1000 nm.

14. The transparency of claim 1, wherein the first region of the conductive coating comprises a gradient coating in which the first thickness of the first region of the conductive coating decreases gradually according to radial distance from a center of the first surface of the substrate.

15. The transparency of claim 1, wherein the first power density of the first region is a constant power density over an entirety of the first region and wherein the second power density of the u-shaped second region gradually increases moving away from the first region towards the peripheral edge of the transparency.

16. The transparency of claim 15, wherein the first power density of the first region is about 0.44 watt/in$^2$ and the second power density of the u-shaped second region is between about 0.46 watt/in$^2$ and 0.56 watt/in$^2$.

* * * * *